(12) United States Patent
Nakashiba

(10) Patent No.: US 8,334,915 B2
(45) Date of Patent: Dec. 18, 2012

(54) SOLID-STATE IMAGE PICKUP DEVICE

(75) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 490 days.

(21) Appl. No.: 11/641,016

(22) Filed: Dec. 19, 2006

(65) Prior Publication Data

US 2007/0171291 A1 Jul. 26, 2007

(30) Foreign Application Priority Data

Jan. 26, 2006 (JP) .................................. 2006-018084

(51) Int. Cl.
*H04N 5/335* (2006.01)
*H01L 27/146* (2006.01)
*H01L 27/00* (2006.01)
(52) U.S. Cl. ...................... 348/294; 257/443; 250/208.1
(58) Field of Classification Search .......... 348/290–294; 257/291, 292, 443; 250/208.1
See application file for complete search history.

(56) References Cited

U.S. PATENT DOCUMENTS

| | | | | |
|---|---|---|---|---|
| 3,961,355 | A | * | 6/1976 | Abbas et al. .................. 257/398 |
| 7,166,878 | B2 | * | 1/2007 | Janesick et al. ............... 257/290 |
| 2002/0005906 | A1 | * | 1/2002 | Ohkubo et al. ............... 348/294 |
| 2006/0006488 | A1 | * | 1/2006 | Kanbe .......................... 257/443 |

FOREIGN PATENT DOCUMENTS

| | | |
|---|---|---|
| JP | 2-159761 | 6/1990 |
| JP | 4-320061 | 11/1992 |
| JP | 7-14996 | 1/1995 |
| JP | 2002-033469 | 1/2002 |
| JP | 2002-151730 | 5/2002 |
| JP | 2003-338615 | 11/2003 |
| JP | 2004-153175 | 5/2004 |
| JP | 2005-110896 | 4/2005 |

OTHER PUBLICATIONS

Chinese Patent Office issued a Chinese Office Action dated May 22, 2009, Application No. 20071000813.4.
Japanese Office Action dated May 31, 2011 in corresponding Japanese Application No. 2006-018084 with English translation of Japanese Office Action.
JP Office Action dated Feb. 28, 2012, with English Translation.

* cited by examiner

*Primary Examiner* — Chieh M Fan
*Assistant Examiner* — Akshay Trehan
(74) *Attorney, Agent, or Firm* — Young & Thompson

(57) ABSTRACT

A solid-state image pickup device is a solid-state image pickup device of a back-surface incident type which is provided with a semiconductor substrate, a semiconductor layer, and a light receiving section. The semiconductor substrate has a specific resistance $\rho_1$. The semiconductor layer is provided on the surface of the semiconductor substrate. The semiconductor layer has a specific resistance $\rho_2$. Where, $\rho_2 < \rho_1$. The light receiving section is provided in the semiconductor layer. In the solid-state image pickup device, photoelectric conversion of incident light from the image-pickup object onto the back surface of the semiconductor substrate is performed in the inside of the semiconductor substrate or the inside of the semiconductor layer, and signal charges generated by the photoelectric conversion are received by the light receiving section for image pickup of the image-pickup object.

9 Claims, 4 Drawing Sheets

SOLID-STATE IMAGE PICKUP DEVICE

This application is based on Japanese Patent application NO. 2006-018084, the content of which is incorporated hereinto by reference.

BACKGROUND

1. Technical Field

The present invention relates to a solid-state image pickup device, and in particular, to a solid-state image pickup device of a back surface incident type.

2. Related Art

Japanese Laid-open patent publication No. 2002-33469 discloses a solid-state image pickup device of a back-surface incident type. The above solid-state image pickup device is provided with a semiconductor substrate, and a light receiving section formed on the surface layer. Photoelectric conversion of light incident from an image-pickup object onto the back surface of the semiconductor substrate (surface on the opposite side of the light receiving section) is performed in the inside of the semiconductor substrate. Then, as the light receiving section receives signal charges generated by the above photoelectric conversion, image-pickup operation of the image-pickup object is performed.

Moreover, Japanese Laid-open patent publication Nos. 2003-338615, 2004-153175 and 2005-110896, other than the above-described document, have been given as conventional technical documents relating with the present invention.

SUMMARY OF THE INVENTION

However, the solid-state image pickup device described in Japanese Laid-open patent publication NO. 2002-33469 has room for improvement in sensitivity. One of reasons that the sensitivity of the above solid-state image pickup device is reduced is that a part of the signal charges generated in the inside of the semiconductor substrate disappear by recombination before they reach the light receiving section formed on the surface layer of the semiconductor substrate.

One of solutions of the above problem may be to make the semiconductor substrate thinner in such a way that the signal charges may reach the light receiving section more easily. However, thinning of the semiconductor substrate causes reduction in the mechanical strength of the above semiconductor substrate, and, in its turn, that of the solid-state image pickup device.

According to the present invention, there is provided a solid-state image pickup device, including: a semiconductor substrate with a first specific resistance; a semiconductor layer provided on a first surface of the semiconductor substrate, and having a second specific resistance smaller than the first specific resistance; and a light receiving section provided in the semiconductor layer, wherein photoelectric conversion of incident light from an image-pickup object onto a second surface of the semiconductor substrate, which is on the opposite side of the first surface, is performed in the inside of the semiconductor substrate or the inside of the semiconductor layer, and electric charges generated by the photoelectric conversion are received by the light receiving section for image pickup of the image-pickup object.

The above solid-state image pickup device uses a semiconductor substrate having a specific resistance larger than that of the semiconductor layer provided with the light receiving section. Therefore, the diffusion length (Debye length) of electrons (signal charges), which contribute to signals, among hole-electron pairs generated by the photoelectric conversion is made longer. Thereby, the signal charges reach the light receiving section more easily. Therefore, the sensitivity of the solid-state image pickup device is improved, while the thickness of the semiconductor substrate is fully secured.

According to the present invention, a solid-state image pickup device with excellent sensitivity is realized.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, a preferable embodiment of a solid-state image pickup device according to the present invention will be explained in detail, referring to drawings. Here, similar elements in drawings are denoted by the same reference numbers and description will not be repeated in explanation of the drawings.

Figure 1:
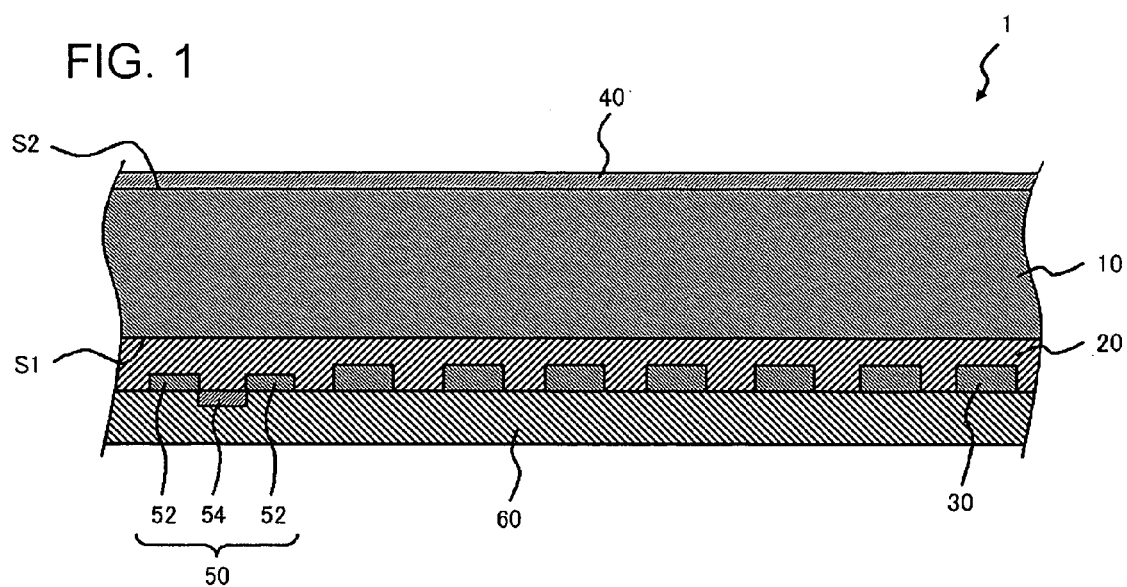
FIG. 1 is a cross-sectional view showing an embodiment of a solid-state image pickup device according to the present invention.

FIG. 1 is a cross-sectional view showing an embodiment of the solid-state image pickup device according to the present invention. The solid-state image pickup device 1 is a solid-state image pickup device of a back-surface incident type which is provided with a semiconductor substrate 10, a semiconductor layer 20, and a light receiving section 30. The semiconductor substrate 10 is a P-type silicon substrate in this embodiment. The above semiconductor substrate 10 has a specific resistance $\rho_1$ (first specific resistance). $\rho_1$ is, for example, 1000 Ωcm. The value is preferably, $\rho_1 \geq 200$ Ωcm, and, more preferably, $\rho_1 \geq 500$ Ωcm.

A semiconductor layer 20 is provided on the surface S1 (first surface) of the semiconductor substrate 10. In this embodiment, the semiconductor layer 20 is a P-type silicon layer. The semiconductor layer 20 has a specific resistance $\rho_2$ (second specific resistance). Here, $\rho_2 < \rho_1$. $\rho_2$ is, for example, 10 Ωcm. Preferably, 5 Ωcm $\leq \rho_2 \leq$ 100 Ωcm. The semiconductor layer 20 is formed by, for example, an epitaxial growth method.

The light receiving section 30 is provided in the semiconductor layer 20. Specifically, the light receiving section 30 is provided in the surface layer of the semiconductor layer 20 wherein the surface layer is on the opposite side of the semiconductor substrate 10. The light receiving section 30 is an N-type impurity diffusion layer in this embodiment. This light receiving section 30, together with the adjacent semiconductor layer 20, forms a photo diode.

The solid-state image pickup device 1 has a configuration in which photoelectric conversion of incident light from the image-pickup object onto the back surface S2 (second surface) of the semiconductor substrate 10 is performed in the inside of the semiconductor substrate 10 or the inside of the semiconductor layer 20, and signal charges generated by the above photoelectric conversion are received by the light receiving section 30 for image pickup of the above image-pickup object.

An insulating film 40 is provided on the back surface S2 of the semiconductor substrate 10. Here, the insulating film 40 is provided as required, that is, the insulating film 40 is not always required. For example, a SiN film, a SiON film or a SiO$_2$ film, or a laminated film thereof, or a resin is given as an example of the insulating film 40. By providing the insulating film 40, impurities and contaminants may be prevented from entering from the back surface S2 into the inside. The back surface S2 is connected to a ground (GND). That is, a GND potential is given to the back surface S2 as a fixed potential at operation of the solid-state image pickup device 1.

A metal oxide semiconductor field effect transistor (MOSFET) 50 is also formed in the semiconductor layer 20. That is, a metal oxide semiconductor (MOS) image sensor constituted by the light receiving section 30 and the like, and a logic circuit section constituted by the MOSFET 50 and the like are combined in the solid-state image pickup device 1. The MOSFET 50 includes an N-type impurity diffusion layer 52 which functions as a source-drain region, and a gate electrode 54.

An interconnect layer (layer in which interconnects are provided in an insulating layer) 60 is provided on the surface (surface on the opposite side of the semiconductor substrate 10) of the semiconductor layer 20. Interconnects (not shown) are formed in the above interconnect layer 60.

Figure 2:
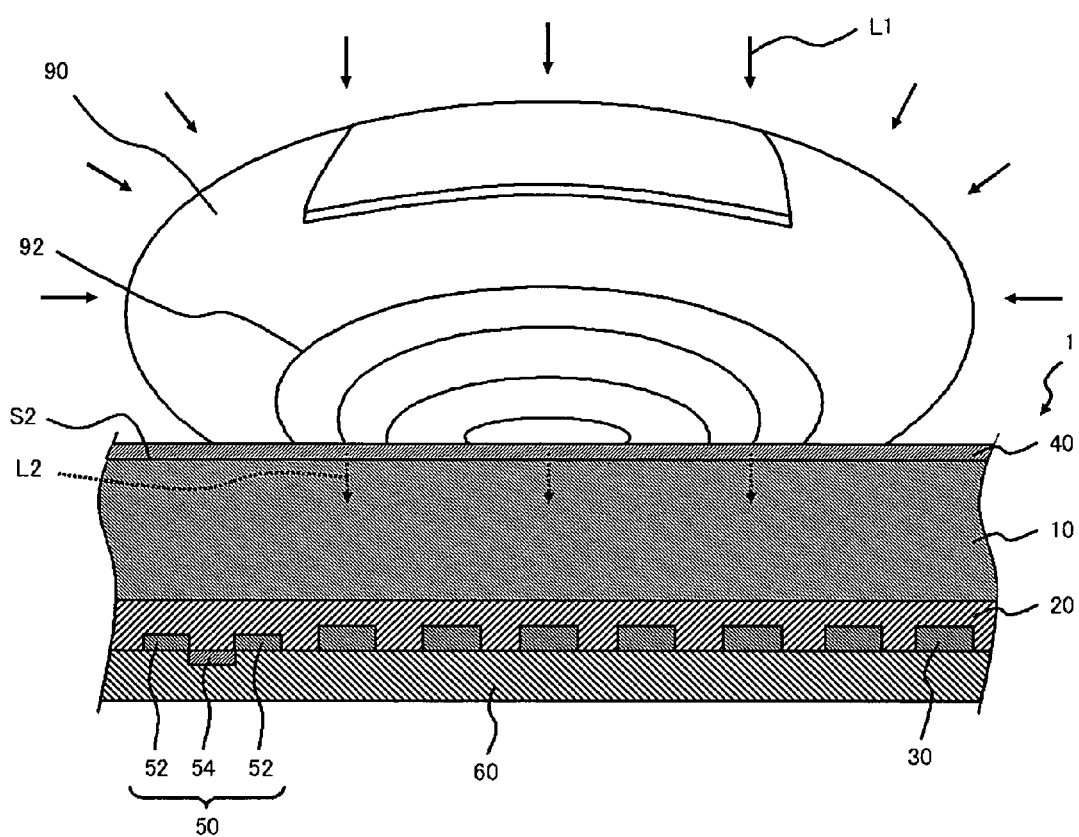
FIG. 2 is a cross-sectional view explaining an example of operations of the solid-state image pickup device shown in FIG. 1.

An example of operation of the solid-state image pickup device 1 will be explained, referring to FIG. 2. In the drawing, a finger 90 as an image-pickup object is in contact with the back surface (the back surface S2 of the semiconductor substrate 10) of the solid-state image pickup device 1. When light L1 from a light source such as a fluorescent lamp, a light emitting diode (LED), and the like is made incident on a finger 90, transmitted light L2 thereof is made incident on the above-described back surface. At this time, the transmitted light L2 is configured to include information on the shape of a finger print 92 on the finger 90. Then, photoelectric conversion of the transmitted light L2 is performed in the inside of the semiconductor substrate 10 or the inside of the semiconductor layer 20. Signal charges generated by the above photoelectric conversion are received by the light receiving section 30 for image pickup of the image of the finger print 92. Light L1 can be any of visible light, the near infrared light or the infrared light.

The effect of the present embodiment will be explained. The solid-state image pickup device 1 uses the semiconductor substrate 10 having a larger specific resistance than that of the semiconductor layer 20 in which the light receiving section 30 is provided. Therefore, the diffusion length of electrons (signal charges), which contribute to signals, among hole-electron pairs generated by the photoelectric conversion is made longer. Thereby, the signal charges reach the light receiving section more easily. Therefore, the sensitivity of the solid-state image pickup device 1 is improved, while the thickness of the semiconductor substrate 10 is fully secured.

Here, the above-described diffusion length (Debye length) $L_d$ is expressed by the following formula (1) As seen from the formula, a larger specific resistance of a medium (the semiconductor substrate 10 or the semiconductor layer 20 in the case of the solid-state image pickup device 1) causes $C_B$ (impurity concentration) to becomes smaller, thereby, $L_d$ (Debye length) becomes larger. Therefore, by a configuration in which the specific resistance $\rho_1$ of the semiconductor substrate 10 is larger than the specific resistance $\rho_2$ of the semiconductor layer 20, $L_d$ becomes larger than that of a case in which $\rho_1$ is equal to $\rho_2$, or $\rho_1$ is smaller than $\rho_2$. Especially, when $\rho_1 \geqq 200$ $\Omega$cm, $L_d$ remarkably becomes larger. Furthermore, when $\rho_1 \geqq 500$ $\Omega$cm $L_d$ further remarkably becomes larger.

$$L_d = \sqrt{\frac{\varepsilon\varepsilon_0 kT}{q^2 C_B}} \quad (1)$$

Where, $\in$: the dielectric constant of the medium, $\in_0$: the dielectric constant of vacuum, k: the Boltzmann constant, T: an electron temperature, q: an elementary charge, and $C_B$: the impurity concentration of the medium.

The insulating film 40 is provided on the back surface S2 of the semiconductor substrate 10. Thereby, the contaminants are prevented from entering from the back surface S2 into the inside of the solid-state image pickup device 1. For example, sodium is given as an example of the above contaminants. Considering the above point, sweat, which came out from the finger, includes the sodium. Therefore, the existence of the insulating film 40, by which the sodium is prevented from entering into the inside, becomes specially important for a case in which, as described in the above example, image pickup is performed under a state in which the finger is in contact with the solid-state image pickup device 1. Furthermore, when the insulating film 40 includes a nitride film such as SiN, the above-described effect obtained by the insulating film 40 becomes specially remarkable.

The back surface S2 of the semiconductor substrate 10 is configured to be connected to GND. Thereby, the back surface S2 can function as electrostatic shielding.

When the semiconductor layer 20 is formed by the epitaxial growth method, that is, when the layer 20 is an epitaxial layer, there can be easily formed the layer 20 which has a specific resistance smaller than that of the semiconductor substrate 10. Moreover, in the case of the epitaxial layer, the specific resistance may be sharply changed from the specific resistance $\rho_1$ of the semiconductor substrate 10 to the specific resistance $\rho_2$ of the semiconductor layer 20.

When 5 $\Omega$cm$\leqq\rho_2\leqq 100$ $\Omega$cm, the light receiving section 30, MOSFET 50, and the like are more easily manufactured. The reason is that the manufacturing can be performed by using an existing device process without alteration.

The solid-state image pickup device 1 is of the back-surface incident type. Therefore, the image-pickup object is not required to be in contact with the surface side (side of the interconnection layer 60) of the solid-state image pickup device 1. Thereby, damages, characteristic deterioration, electrostatic discharge damages, and the like of the solid-state image pickup device 1 are prevented from generating. The above prevention contributes to improvement in the reliability of the solid-state image pickup device 1. For example, when the image-pickup object is a finger, the interconnections are located on the opposite side of the electrically charged finger. Accordingly, excessive static electrical charges caused by the finger are prevented from being applied to elements (the light receiving section 30, the MOSFET 50, and the like) provided in the semiconductor layer 20.

Moreover, the surface of the solid-state image pickup device 1 is not required to be exposed for contact between the image-pickup object and the device 1, because the solid-state image pickup device 1 is of the back-surface incident type. Thereby, various kinds of impurities may be prevented from adhering directly to the surface of the solid-state image pickup device 1. The above adhering of the impurities leads to deterioration in the electric characteristic of the solid-state image pickup device 1.

When near infrared light or infrared light is used as light L1 (refer to FIG. 2), the transmitted light L2 may be configured to reach from the back surface S2 to a deeper position in comparison with a case in which visible light is used. Thereby, the signal charges caused by photoelectric conversion of the transmitted light L2 can reach the light receiving section 30 more easily.

The solid-state image pickup device according to the present invention is not limited to the above-described embodiment, but various kinds of variations may be executed. In the above-described embodiment, the semiconductor layer 20 may be formed, for example, by ion implantation. That is, impurity ions are injected into the surface layer of the semiconductor substrate to make the specific resistance thereof smaller, and the surface layer after the above-described injection may be applied as the semiconductor layer 20. Or, two semiconductor substrates with different specific resistances from each other are mutually bonded together, and the semiconductor substrate having a comparatively small specific resistance after the above bonding may be applied as the semiconductor layer 20.

Figure 3:
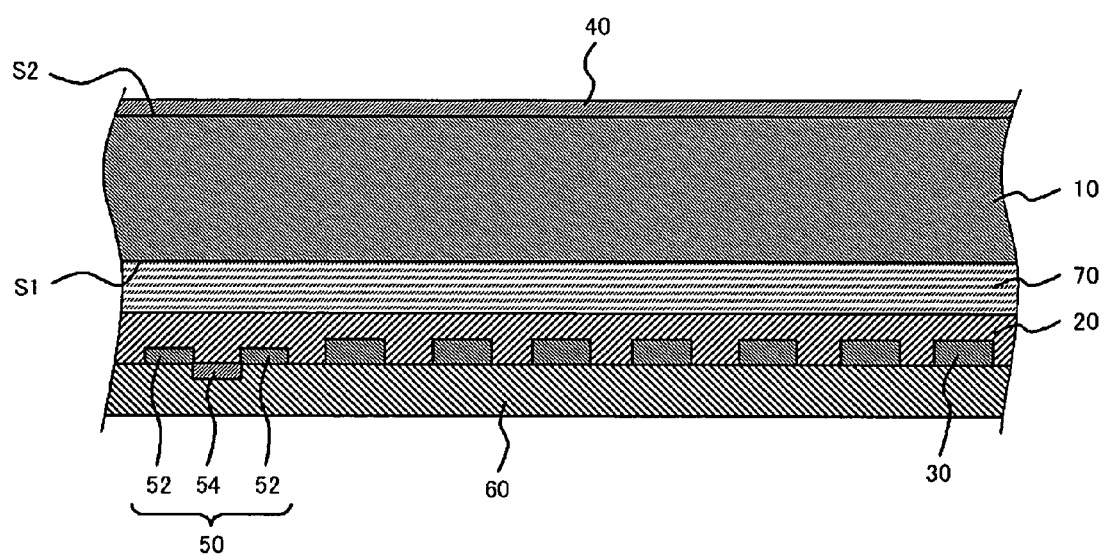
FIG. 3 is a cross-sectional view showing a solid-state image pickup device according to a variation of the above embodiment.

Moreover, there is illustrated an example in which the semiconductor layer 20 is provided directly on the semiconductor substrate 10. However, a semiconductor layer 70 (second semiconductor layer) may be inserted between the semiconductor substrate 10 and the semiconductor layer 20 as shown in FIG. 3. The semiconductor layer 70 has the same conductivity type as that of the semiconductor substrate 10. The above semiconductor layer 70 has a specific resistance $\rho_3$ (third specific resistance). Where, $\rho_2 < \rho_3 < \rho_1$, or $\rho_2 < \rho_1 < \rho_3$. Moreover, the semiconductor layer 70 may be formed in a similar manner to that of the semiconductor layer 20 by the epitaxial growth method, the ion injection, or by a configuration in which semiconductor substrates with different specific resistances from each other are bonded to each other.

Furthermore, explanation of the above embodiment illustrated that the N-channel MOSFET (MOSFET 50 in FIG. 1) is formed in the solid-state image pickup device 1, but a P-channel MOSFET may be further formed. Moreover, the explanation of the above embodiment illustrated the P-type semiconductor substrate, the P-type semiconductor layer, and the N-type light receiving section, but an N-type semiconductor substrate, an N-type semiconductor layer, and a P-type light receiving section may be applied.

Figure 4:
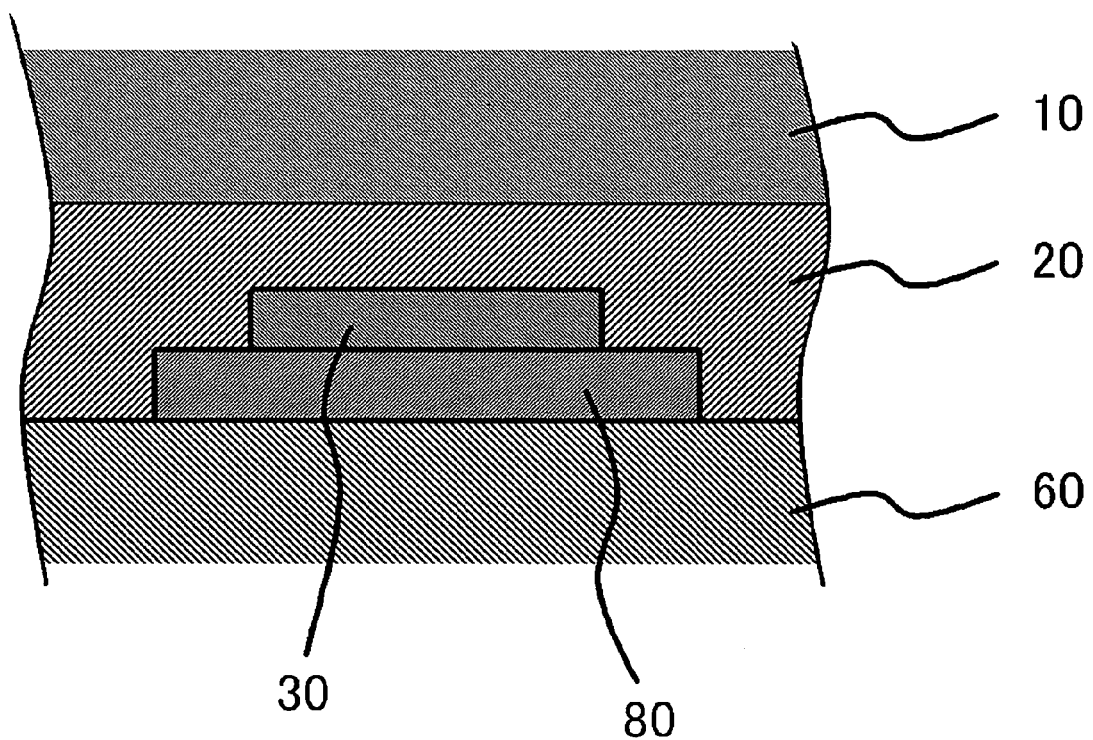
FIG. 4 is a cross-sectional view explaining another variation of the above embodiment.

Moreover, the above-described embodiment demonstrated the example in which the light receiving section 30 is provided in the surface layer of the semiconductor layer 20. However, the light receiving section 30 may be provided in the inside of the semiconductor layer 20 as shown in FIG. 4. In the above drawing, a P+ type impurity diffusion layer 80 is provided in the surface layer of the semiconductor layer 20, and the light receiving section 30 is provided on the P+ type impurity diffusion layer 80. That is, the P+ type impurity diffusion layer 80, the light receiving section 30 and the semiconductor layer 20 constitute an embedded-type photo diode. The P+ type impurity diffusion layer 80 functions as a shield layer. Thereby, influences of noises from the surface of the semiconductor layer 20 on the light receiving section 30 can be made small.

Moreover, the present invention may be applied to a solid-state image pickup device of a charge-coupled-device (CCD) type.

It is apparent that the present invention is not limited to the above embodiment, and may be modified and changed without departing from the scope and spirit of the invention.

What is claimed is:

1. A solid-state image pickup device, comprising:
    a semiconductor substrate with a first specific resistance;
    a semiconductor layer continuously provided along an entire continuous first surface of said semiconductor substrate, and having a second specific resistance smaller than said first specific resistance; and
    a light receiving section provided in said semiconductor layer adjacent to said first surface of said semiconductor substrate,
    wherein a p-n junction is provided in said semiconductor layer, and said p-n junction is formed by said semiconductor layer and said light receiving section,
    wherein photoelectric conversion of incident light from an image-pickup object onto a second surface of said semiconductor substrate, which is on the opposite side of said first surface, is performed in the inside of said semiconductor substrate or the inside of said semiconductor layer, and electric charges generated by said photoelectric conversion are received by said light receiving section for image pickup of said image-pickup object, and
    wherein the specific resistance of a part of said semiconductor layer that overlaps said light receiving section in a plan view is equal to that of the other part of said semiconductor layer that does not overlap said light receiving section in the plan view.

2. The solid-state image pickup device according to claim 1, comprising: an insulating film provided on said second surface of said semiconductor substrate.

3. The solid-state image pickup device according to claim 1, wherein said second surface of said semiconductor substrate is connected to a ground.

4. The solid-state image pickup device according to claim 1, wherein said semiconductor layer is an epitaxial layer.

5. The solid-state image pickup device according to claim 1, further comprising: a second semiconductor layer provided between said semiconductor substrate and said semiconductor layer, and having a third specific resistance smaller than said first specific resistance and larger than said second specific resistance.

6. The solid-state image pickup device according to claim 1, wherein said first specific resistance is 200 Ωcm or more.

7. The solid-state image pickup device according to claim 6, wherein said first specific resistance is 500 Ωcm or more.

8. The solid-state image pickup device according to claim 1, wherein said second specific resistance is 5 Ωcm or more, and 100 Ωcm or less.

9. A solid-state image pickup device according to claim 1, wherein a whole surface area of said light receiving section at said semiconductor substrate side comes in contact with said semiconductor layer.

* * * * *